United States Patent [19]

Matsuzaki

[11] Patent Number: 4,851,889
[45] Date of Patent: Jul. 25, 1989

[54] INSULATED GATE FIELD EFFECT TRANSISTOR WITH VERTICAL CHANNEL

[75] Inventor: Kazuo Matsuzaki, Yokosuka, Japan

[73] Assignee: Fuji Electric Co., Ltd., Kawasaki, Japan

[21] Appl. No.: 127,229

[22] Filed: Dec. 1, 1987

[30] Foreign Application Priority Data

Dec. 3, 1986 [JP]  Japan .............................. 61-288386

[51] Int. Cl.$^4$ ...................... H01L 29/78; H01L 29/06
[52] U.S. Cl. .................................... 357/23.4; 357/56; 357/38
[58] Field of Search ........................... 357/23.4, 38, 56

[56] References Cited

U.S. PATENT DOCUMENTS

| | | | |
|---|---|---|---|
| 4,546,367 | 10/1985 | Schutten et al. | 357/23.4 |
| 4,611,235 | 9/1986 | Bhagat | 357/56 |
| 4,641,164 | 2/1987 | Dolny et al. | 357/23.4 |
| 4,680,604 | 7/1987 | Nakagawa | 357/38 |

FOREIGN PATENT DOCUMENTS

| | | | |
|---|---|---|---|
| 0159663 | 10/1985 | European Pat. Off. | 357/23.4 |
| 54-4079 | 1/1979 | Japan | 357/23.4 |
| 55-91874 | 7/1980 | Japan | 357/23.4 |
| 56-74960 | 1/1981 | Japan | 357/23.4 |

*Primary Examiner*—Andrew J. James
*Assistant Examiner*—Jerome Jackson, Jr.
*Attorney, Agent, or Firm*—Brumbaugh, Graves, Donohue & Raymond

[57] ABSTRACT

A conductivity modulated type field effect transistor, having a drain region of a first conductivity type with an associated drain electrode, a conductivity modulating region of a second conductivity type opposed to that of the drain region, a channel region of the first conductivity type and a source region of the second conductivity type formed consecutively on top of one another. The channel forming region has a low resistance layer of the same conductivity type formed in the middle of the region such that small portions of the channel forming region of higher resistance are left intact at the sides of the region, and the source region penetrates into the channel forming region at the sides of the region adjacent to the low resistance layer. The length of the conductivity modulating region and drain region is such that they protrude beyond the channel forming region, and a gate insulating film is formed over the conductivity modulating region at the protruding portion such that it covers the sides of the channel forming region and a portion of the top of the source region. A gate electrode is formed over the gate insulating film and a source electrode is formed over the channel forming region and the source region.

1 Claim, 4 Drawing Sheets

INSULATED GATE FIELD EFFECT TRANSISTOR WITH VERTICAL CHANNEL

BACKGROUND OF THE INVENTION

The present invention relates to a high power switching semiconductor device which has high input impedance and high speed switching characteristics.

It is known in the art to employ a bipolar transistor or an insulated gate transistor as power switching semiconductor devices. A typical bipolar transistor construction is shown in FIG. 1 wherein reference numeral 1 denotes a base electrode, numeral 2 a base region (P), numeral 3 an emitter electrode, numeral 4 an emitter region (N), numeral 5 a collector region (N−), numeral 6 a collector region (N+) having a higher impurity concentration than the collector region 5, and numeral 7 a collector electrode. This bipolar transistor is of the current control type, in which a minority carrier injection from the emitter region 4 is excited by a base current to collect most of the minority carriers in the collector through the base region 2. The low input impedance bipolar transistor of this type cannot, however, effectively respond to use in high speed switching operations, and its operating range is further restricted due to secondary breakdown.

FIG. 2 shows a conventional insulated gate transistor wherein reference numeral 8 denotes a gate electrode, numeral 9 a gate oxide film, numeral 10 a source electrode, numeral 11 a source region (N+), numeral 12 a channel region (P), numeral 13 a drain region (N−) having a low impurity concentration, numeral 14 a drain region (N+) having a high impurity concentration, and numeral 15 a drain electrode. This insulated gate transistor is a voltage drive type switching element and is typically utilized as a power switching element because of its high input impedance and high speed switching characteristics. However, it is difficult to form the insulated gate transistor with a low resistance region and its unipolar type construction is not well suited for high power applications because, in use, majority carriers flow between the source and the drain due to channel induction.

FIG. 3 shows the structure of an insulated gate transistor of the conductivity modulated type, which are considered to be an improvement over the devices described above. In FIG. 3, the common portions shared with FIG. 2 are denoted with identical reference numerals. The structure of FIG. 3 is different from that of FIG. 2 in that a drain region 16 (P+) having a conductivity type opposed to that of the drain region 14 of FIG. 2 is formed to effect injection of the minority carriers from the drain region. A conductivity modulation is effected in the drain region 13 (N−) so as to enlarge the current density, thereby giving the device of FIG. 3 lower resistance and a higher operating power range. This device is susceptible to exhibiting an unwanted thyristor operation, because of the N-P-N-P structure, and is intended to suppress occurrence of latchup phenomena. FIG. 4 shows an improvement over the structure of FIG. 3. In FIG. 4, the common portions shared with FIG. 3 are denoted with identical reference numerals. The improvement resides in a low resistance layer 17 (P+), of the same conductivity type as the channel region 12, formed below the channel region 12 to dampen, as much as possible, the injection of minority carriers into the source region 11 (N+) channel. This reduces the voltage drop between the source and the drain due to hole current to prevent occurrence of latchup. Although the description of the devices herein is directed to the case of an N-channel element, the conductivity types N and P may be wholly inverted for a P-channel element.

These known devices suffer a great deficiency in that during the fabrication thereof, if the low resistance layer 17 is to be formed below or in the channel region 12, as shown in FIG. 4, it is difficult to cause the low resistance layer 17 to completely enclose the channel region, excluding the current path of the majority carriers from the source region 11 to the drain region 13, without eliminating the channel portion. Since, moreover, it is impossible to reduce the resistance of the low resistance layer 17 infinitely without influencing the channel portion, the reduction in the voltage drop due to the minority carriers between the source and the drain is restricted. The fabrication of this conductivity modulated type transistor results in a structure which does not eliminate the channel portion of the channel forming region, which is necessary to dampen the injection of minority carriers into the source region to thereby reduce the voltage drop caused by the minority carrier current, since the current path of the majority carriers from the source region to drain region is enclosed completely within the low resistance layer. Furthermore, it is extremely difficult to control the channel length partly because the formation of the channel region 12 and the source region 11 are performed by a double diffusion process using the gate electrode 8 as a diffusion mask, and partly because restrictions are imposed upon the impurity of materials and the diffusion conditions used to form those regions.

Therefore, it is an object of the present invention to provide a novel insulated gate field effect transistor having a high input impedance and high speed switching characteristics, and which has a structure that will cause conductivity modulation for low current density. It is a further object of the invention to provide a novel insulated gate field effect transistor which has high input impedance and is useful for high power application, and can be fabricated without any of the aforementioned deficiencies of the prior art devices. It is a still further object of the invention to prevent occurrences of thyristor operation and latchup associated with insulated gate transistors of the conductivity modulated type.

SUMMARY OF THE INVENTION

These and other objects are achieved by a conductivity modulated type field effect transistor, in accordance with the present invention, having a drain region of a first conductivity type with an associated drain electrode, a conductivity modulating region of a second conductivity type opposed to that of the drain region, a channel region of the first conductivity type and a source region of the second conductivity type formed consecutively on top of one another. The channel forming region has a low resistance layer of the same conductivity type formed in the middle of the region such that small portions of the channel forming region of higher resistance are left intact at the sides of the region, and the source region penetrates into the channel forming region at the sides of the region adjacent to the low resistance layer. The length of the conductivity modulating region and drain region is such that they protrude beyond the channel forming region, and a gate insulating film is formed over the conductivity modulating region at the protruding portion such that it covers the sides of the channel forming region and a portion of the top of the source region. A gate electrode is formed over the gate insulating film and a source electrode is formed over the channel forming region and the source region.

For a better understanding of the invention, as well as other objects and further features thereof, reference is had to the following detailed description of the preferred embodiments taken in conjunction with the accompanying drawings.

DESCRIPTION OF THE PREFERRED EMBODIMENT

Figure 1:
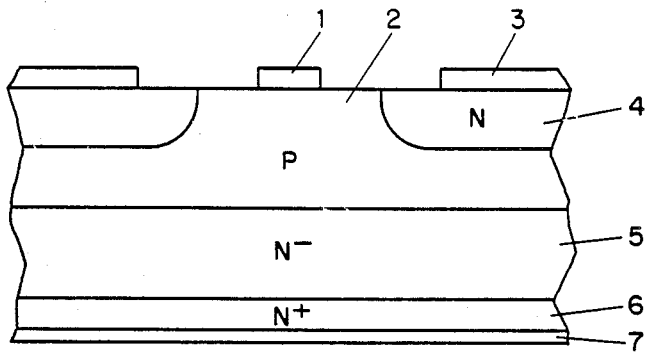
FIG. 1 is an elevational view showing a bipolar transistor according to the prior art.
Figure 2:
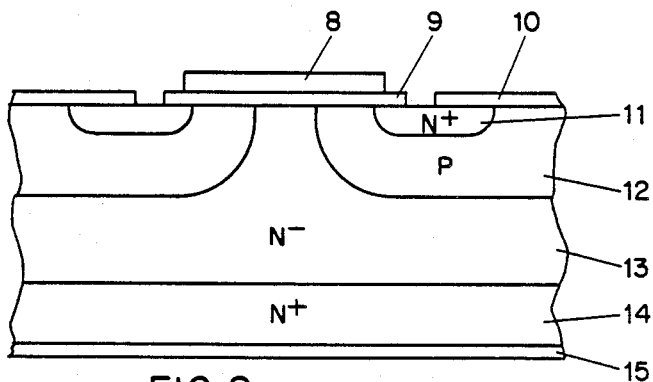
FIG. 2 is an elevational view showing an insulated gate transistor according to the prior art.
Figure 3:
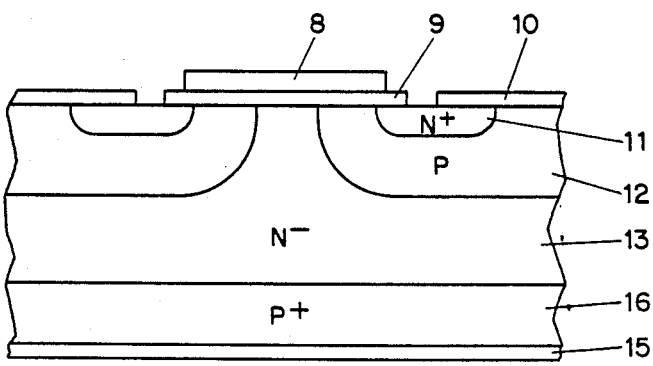
FIG. 3 is an elevational view showing an insulated gate transistor of conductivity modulated type according to the prior art.
Figure 4:
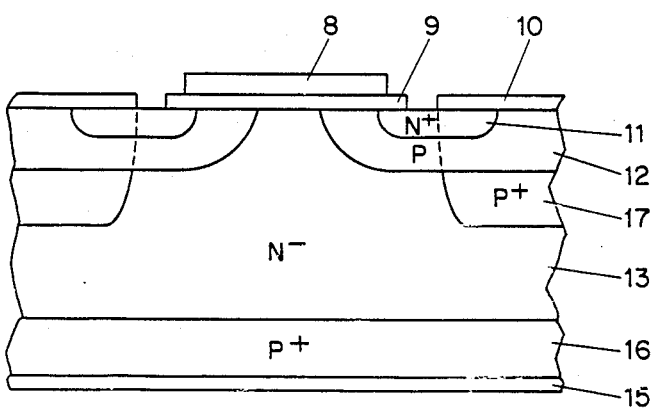
FIG. 4 is an elevation view showing an insulated gate transistor of conductivity modulated type improved over that of FIG. 3.
Figure 5:
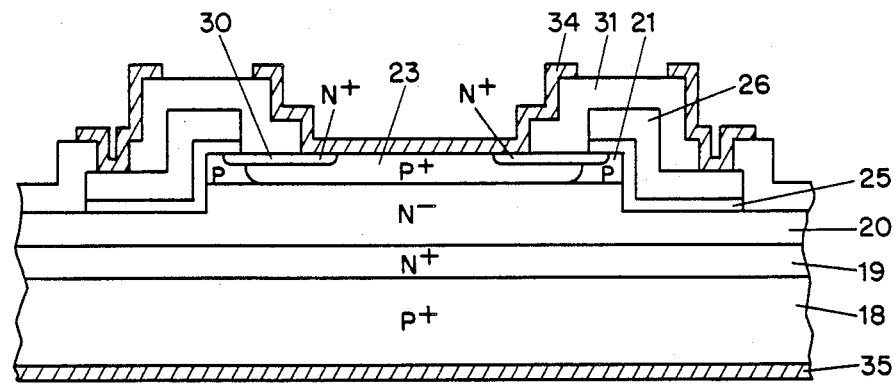
FIG. 5 is a sectional elevational view showing an insulated gate field effect transistor according to the present invention.
Figure 6A:
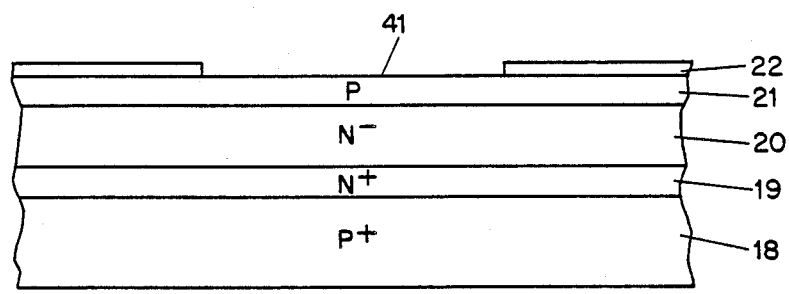
FIGS. 6A–6D, 7 and 8 are sectional elevational views showing various fabricating steps in construction of the field effect transistor of FIG. 5.
Figure 6B:
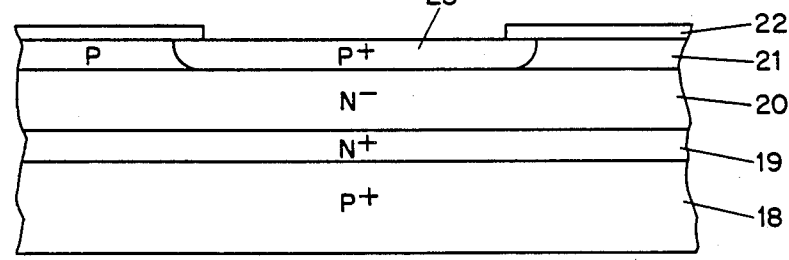
Figure 6C:
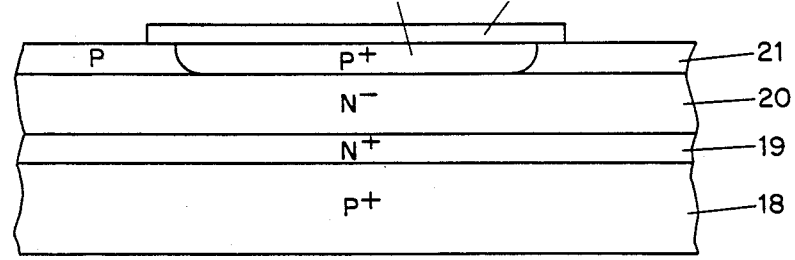
Figure 6D:
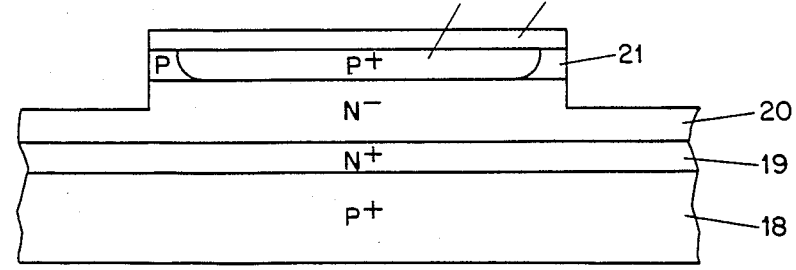
Figure 7E:
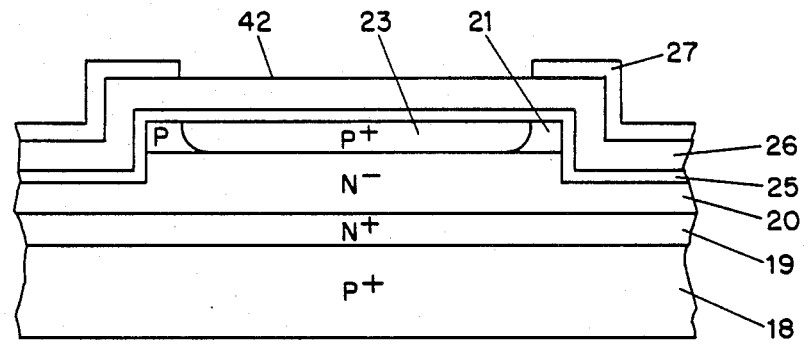
Figure 7F:
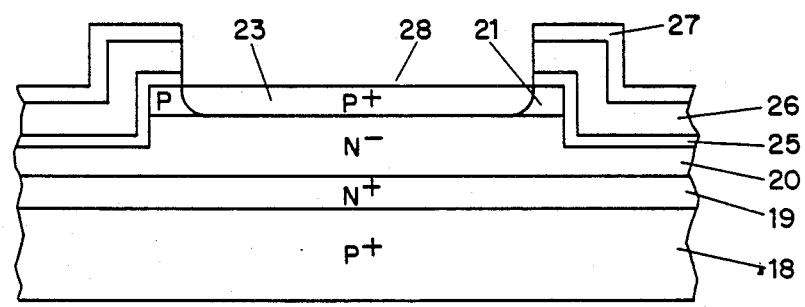
Figure 7G:
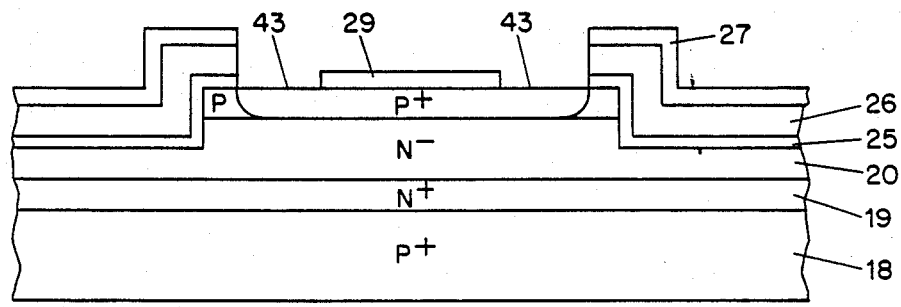
Figure 8H:
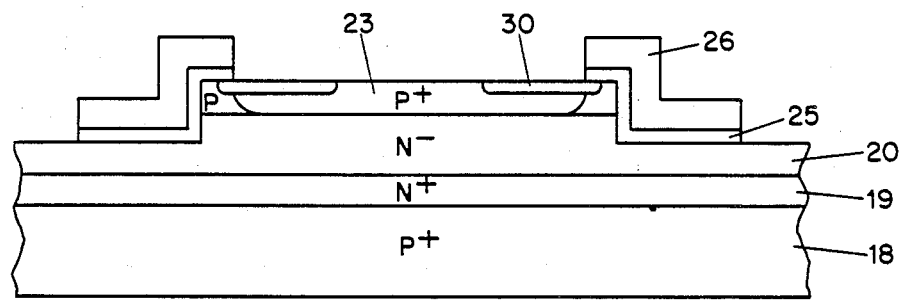
Figure 8I:
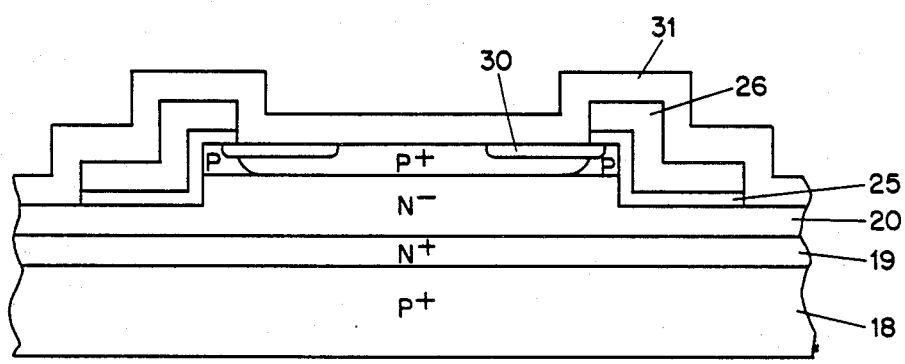
Figure 8J:
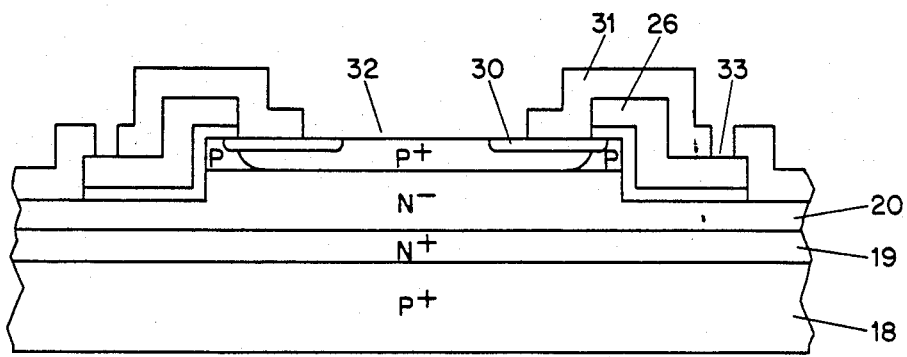

With reference to FIGS. 6, 7 and 8 the fabrication of the embodiment of FIG. 5 will now be described.

First, an N+-type layer 19, an N−-type layer 20 and a P-type layer 21 are caused to grow epitaxially on a P+-type substrate 18 to form a silicon wafer. The surface of the P-type layer 21 of the silicon wafer is oxidized, and the oxide film is subsequently removed from the surface except at a diffusion portion 41 to form an oxide film 22 to be used as a diffusion mask (as shown at A in FIG. 6). This diffusion mask 22 is used to form a P+-type diffusion layer 23 extending through the P-type layer 21 to the N−-type layer 20 (as shown at B in FIG. 6). An oxide film or resistor 24 is formed to cover the P+-type diffusion layer 23 (as shown at C in FIG. 6). The oxide film or resistor 24 is used as a mask to etch and selectivity remove the portion of the P-type layer 21 and approximately one half of the N−-type layer 20 extending beyond the oxide film 24, thereby leaving a portion of the P-type layer 21 intact (as shown at D in FIG. 6). A gate oxide film 25 and a polysilicone film 26 are consecutively formed across the whole surface to cover the N−, P and P+ regions, and are thereafter covered with a resistor 27 except at a contact portion 42 (as shown at E in FIG. 7). The resistor 27 is used as a mask to selectively remove the gate oxide film 25 and the polysilicone film 26 at the contact portion 32 to expose a contact forming portion 28 with the source and the P+-type layer 23 to the outside (as shown at F in FIG. 7). The exposed P+-type base layer 23 is masked with a resistor 29, except at an N+-type source forming region 43, (as shown at G in FIG. 7). The resistor 29 is used as a mask to inject ions to form an N+-type source region 30, and the resistors 27 and 29 are thereafter removed (as shown at H in FIG. 8). A CVD oxide film 31 is formed as a surface protecting film (as shown at I in FIG. 8). The oxide film 31 is removed to form a contact hole 32 between the N+-type source region 30 and the P+-type base layer 23, and a contact hole 33 to expose the gate electrode portion comprised of the polysilicone film 26 and gate oxide film 25 (as shown at J in FIG. 8). Aluminum is then evaporated to form electrode 34 and a back electrode 35 (as shown in FIG. 5).

In operation, a channel is formed in the interface between the gate insulating film 25 and the semiconductor channel forming region 21 by applying a voltage higher than a selected threshold value to the gate electrode 26 when the element is in its ON state. As a result, the injection of majority carriers from the source region 30 and the injection of minority carriers from the semiconductor drain region 18 occur simultaneously in the conductivity modulating region 20 to increase the density of the current flowing in the conductivity modulating region 20. By forming the low resistance layer 23 over the channel region 21 as described above, the voltage drop due to the minority carrier current injected from the drain region 18 can be reduced to substantially prevent the thyristor structure from operating. Because of the structure's reluctance to latchup, the present transistor can have a high input impedance, and high speed switching characteristics suitable for high power applications.

With this structure, most of the P-type layer 21 is formed into the P+-type layer 23 and the N+-type source layer 30, while a small portion interfaces with the gate oxide film 25 as the P-type base layer 21. The parasitic operations of the transistor formed of the N+-type source region 30, the P-type base layer 21 and the N−-type conductivity modulating region 20 can be suppressed in order to provide increased latchup current, since most of the P-type base layer 21, is to be formed with an inversion layer when a voltage is applied to the MOS gate.

A significant improvement is provided over the prior art since the channel forming region is protruded with respect to the silicon substrate, and the MOS gate is formed on the side of the protrusion such that most of the vicinity of the interface with the gate oxide film, i.e., the portion to be formed with the inversion layer, is formed of a low resistance layer in the source region. As a result, the parasitic transistor operations, which might otherwise be effected among the source, or channel forming region, can be suppressed and a large conductivity modulating region can be prevented to thereby increase latchup current capability. Moreover, since the width of the channel forming region can be determined during fabrication of the device by controlling the thickness of the epitaxial layers, there is provided a simple and accurate method of setting and controlling channel length. Thus, there is provided an insulated gate field effect transistor which has a high input impedance and high speed switching characteristics which can be utilized in high power applications.

The detailed description of the preferred embodiment of the invention having been set forth herein for the purpose of explaining the principles thereof, it is known that there may be modifications, variation or change in the invention without departing from the proper scope of the invention and the claims thereto.

I claim:

1. A conductivity modulated field effect transistor comprising:

a first semiconductor layer (18) of one conductivity type forming a drain region and having a drain electrode formed thereon;

a second semiconductor layer (19) of a second conductivity type opposite that of said first semiconductor layer, formed over and in contact with said first semiconductor layer;

a conductivity modulating region comprising a third semiconductor layer (20) of the same conductivity type as said second layer, formed over said second layer, a portion of the area of said third layer being thicker than the remaining area and defined by side edges disposed substantially perpendicularly to said third layer, said conductivity modulating region having a recombination region near the surface of said thicker portion furthest from said second semiconductor layer and limited to the area of said portion by said side edges;

a channel region of first conductivity type formed over the entire area of the upper surface of the portion of the recombination region defined by said side edges with said remaining area of said conductivity modulating region and the corresponding area of said first and second semiconductor layers extending laterally from said channel region including a low resistance layer (23) of a first conductivity type formed over all of the surface of said thicker portion of said third semiconductor layer (20) in contact with said recombination region except for channel forming region (21) of the same conductivity type as said low resistance layer formed over said thicker portion of said third semiconductor layer and surrounding said low resistance layer and limited by upward extensions of the side edges which define said thicker portion;

a source region (30) of said second conductivity type disposed on the surface of said low resistance layer remote from said recombination region and penetrating a peripheral portion of said channel region and contacting said channel forming regions;

a gate insulating film (25) partially covering said source region, completely covering the side edges of said channel forming regions (21) and of said thicker portion, of said conductivity modulating region, and partially covering the laterally extending portion of said conductivity modulating region;

a gate electrode (26) formed over and resting directly on said gate insulating film; and a source electrode (34) formed over and in contact with said channel region, and said source region.

* * * * *